(12) United States Patent
Shino et al.

(10) Patent No.: US 6,946,799 B2
(45) Date of Patent: Sep. 20, 2005

(54) DRIVE CIRCUIT

(75) Inventors: Kenji Shino, Kanagawa (JP); Yasukazu Noine, Kanagawa (JP)

(73) Assignees: Canon Kabushiki Kaisha, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/766,817

(22) Filed: Jan. 30, 2004

(65) Prior Publication Data

US 2004/0217950 A1 Nov. 4, 2004

(30) Foreign Application Priority Data

Jan. 30, 2003 (JP) .................................... 2003-021668

(51) Int. Cl.[7] .............................................. G09G 3/30
(52) U.S. Cl. .............................. 315/169.1; 315/169.3; 345/45; 345/76
(58) Field of Search ......................... 315/169.1, 169.3; 345/45, 76

(56) References Cited

U.S. PATENT DOCUMENTS

| | | | |
|---|---|---|---|
| 5,656,892 A | * 8/1997 | Zimlich et al. | 315/169.3 |
| 6,294,876 B1 | 9/2001 | Ando et al. | 315/169.1 |
| 6,404,135 B1 | 6/2002 | Shino | 315/169.1 |
| 6,714,178 B2 | * 3/2004 | Koyama et al. | 345/76 |
| 2002/0195966 A1 | 12/2002 | Aoki et al. | 315/169.3 |
| 2003/0025687 A1 | 2/2003 | Shino et al. | 345/204 |
| 2003/0038792 A1 | 2/2003 | Murayama et al. | 345/204 |
| 2003/0063108 A1 | 4/2003 | Isono et al. | 345/690 |
| 2004/0001039 A1 | 1/2004 | Shino et al. | 345/100 |

FOREIGN PATENT DOCUMENTS

JP    2002-221933    8/2002

* cited by examiner

*Primary Examiner*—David Vu
(74) *Attorney, Agent, or Firm*—Fitzpatrick, Cella, Harper & Scinto (57) ABSTRACT

A drive circuit includes a drive transistor connected at a pair of its main electrodes respectively to a drive output terminal side and a reference voltage source VEE side, an operational amplifier for controlling an output voltage that is output from the drive transistor, a detection transistor for detecting a current that flows through the drive transistor, a first feedback loop for detecting an output voltage at the drive output terminal and feeding back the output voltage to the operational amplifier, and a second feedback loop for detecting an output current of the detection transistor and feeding back the output current to the operational amplifier. The drive transistor and the detection transistor form a mirror circuit.

16 Claims, 8 Drawing Sheets

DRIVE CIRCUIT

BACKGROUND OF THE INVENTION

1. Field of the Invention

The present invention relates to a drive circuit for an emitting device that emits at least light or electrons, such as a light emitting diode, a semiconductor laser, an electroluminescence device, or an electron-emitting device.

2. Description of the Related Art

If an emitting device and a drive circuit are connected to each other by a wiring member such as a flexible wiring board and the emitting device is driven, a voltage drop is caused in a wiring member by resistance in the wiring member and a current flowing through the wiring member and the effective drive voltage actually applied to the emitting device might become lower than the output drive voltage of the drive circuit.

Figure 8:
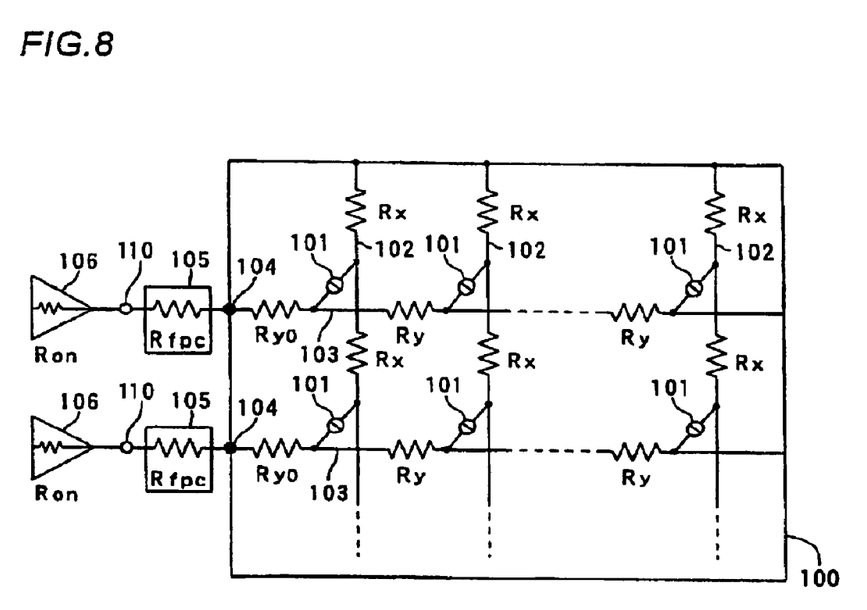
FIG. 8 is a schematic diagram showing a matrix display panel obtained by combining surface conduction electron-emitting devices with phosphors.

FIG. 8 is a diagram schematically showing a matrix display panel 100 formed by combining surface conduction electron-emitting devices 101 and phosphors (not illustrated).

As resistors that affect the effective drive voltage for the electron-emitting devices 101, wiring resistors Rx on column wiring 102 formed of conductors such as metal and wiring resistors Ry and Ryo on row wiring 103 formed of conductors such as metal can be mentioned. Since currents flows into the row wiring 103 from columns, the wiring resistors Ry and Ryo on the row wiring 103 in a panel 100 become predominant.

A method for compensating the voltage drop caused by the wiring resistors in the panel is disclosed in, for example, Japanese Patent Application Laid-Open (JP-A) No. 2002-221933.

Furthermore, conventionally a large area transistor having a large gate width is used as a switch in an output buffer 106 so as to make the voltage drop caused by on-resistance Ron of the switch in the output buffer 106 in a row drive circuit negligible. Therefore, the occupied area on a chip in the case where the row drive circuit is integrated onto one chip becomes large, and the IC chip becomes expensive.

Therefore, a method using a compensation circuit in which the voltage drop caused by the on-resistance is compensated by using a transistor that is smaller than the conventionally adopted one in the output buffer and feeding back a detected voltage at an output terminal 110 has been studied.

However, even this is not a compensation method that is sufficient for enhancing the precision of the drive. For example, a connection member 105 itself; such as flexible wiring, which connects a row drive circuit to the panel 100, has resistance Rfpc. It is demanded to compensate the voltage drop caused by the connection resistance Rfpc with a relatively simple configuration.

In the above-described compensation circuit in which the voltage drop caused by the on-resistance is compensated by feeding back the detected voltage at the output terminal, the detection terminal must be set on the emitting device side serving as the load as compared with the connection resistance Rfpc. Therefore, extra wiring paths become necessary and the arrangement pitch of conductor patterns of flexible wiring becomes high density, resulting in increased parasitic capacitance and a higher cost.

SUMMARY OF THE INVENTION

An object of the present invention is to provide a drive circuit for emitting device capable of compensating a voltage drop caused by resistance in a connection member and a current flowing through the connection member with high precision by using a relatively simple configuration.

Another object of the present invention is to provide a drive circuit including a drive output terminal for connecting emitting devices that emit at least light or electrons to the drive circuit via a connection member, and a compensation circuit for compensating an output voltage supplied from the drive output terminal, wherein the compensation circuit includes a drive transistor connected at a pair of its main electrodes respectively to the drive output terminal side and a reference voltage source side, an operational amplifier for controlling an output voltage that is output from the drive transistor, a detection transistor for detecting a current that flows through the drive transistor, the drive transistor and the detection transistor forming a mirror circuit, a first feedback loop for detecting the output voltage at the drive output terminal and feeding back the output voltage to the operational amplifier, and a second feedback loop for detecting an output current of the detection transistor and feeding back the output current to the operational amplifier.

According to the configuration, the output voltage is controlled to become constant under the control of the operational amplifier by using the first feedback loop for detecting the output voltage at the drive output terminal and feeding back the output voltage to the operational amplifier. As a result, the variation of the output voltage caused by the voltage drop based on the on-resistance (Ron) of the drive transistor itself can be suppressed.

Another object of the present invention is to provide a drive circuit including a drive output terminal for connecting emitting devices that emit at least light or electrons to the drive circuit via a connection member, and a compensation circuit for compensating an output voltage supplied from the drive output terminal, wherein the compensation circuit includes a drive transistor connected at a pair of its main electrodes respectively to the drive output terminal side and a reference voltage source side, an operational amplifier for controlling an output voltage that is output from the drive transistor, a detection transistor for detecting a current that flows through the drive transistor, a first feedback loop for detecting the output voltage at the drive output terminal and feeding back the output voltage to the operational amplifier, a second feedback loop for detecting a current that flows through the detection transistor and feeding back the detected current to the operational amplifier, and control means for controlling a potential at a control electrode of the detection transistor according to the current that flows through the detection transistor.

According to the configuration, the current flowing through the drive output terminal and the voltage at the drive output terminal are detected in real time by using the detection transistor, and compensation is conducted on the basis of the detected current and voltage. Without providing the voltage detection point beyond the drive output terminal, i.e., on the load side, therefore, the voltage drop caused by the resistance of the connection member and the current flowing through the resistance can be compensated.

DETAILED DESCRIPTION OF THE PREFERRED EMBODIMENTS

Hereafter, preferred embodiments of the present invention will be described in detail by way of examples with reference to the drawings. However, dimensions, materials, shapes and relative arrangements of components described in the embodiments are not intended to restrict the scope of the invention only to them, unless specifically stated.

First Embodiment

Figure 1:
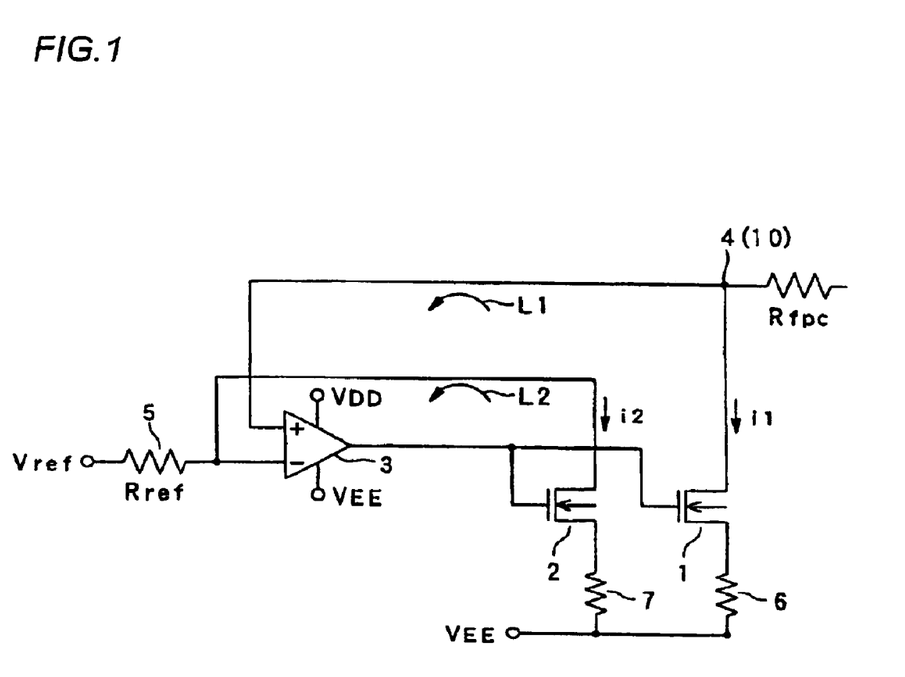
FIG. 1 is a circuit configuration diagram showing a basic example of a drive circuit according to a first embodiment.

A drive circuit according to a first embodiment will now be described with reference to FIG. 1. FIG. 1 is a circuit configuration diagram showing a basic example of a drive circuit according to the present embodiment. FIG. 1 shows a drive circuit having a drive output terminal 4 for connection to emitting devices 101 (see FIG. 8), which emit at least light or electrons, via the connection member 105 (see FIG. 8).

For example, an nMOSFET serving as a drive transistor 1 is connected to the high potential drive output terminal 4 and a low potential reference voltage source VEE respectively at its source and drain serving as a pair of main electrodes.

The drive circuit further includes an operational amplifier 3 for controlling an output voltage Vo output from the drive transistor 1, and an nMOSFET serving as a detection transistor 2 for detecting a current i1 flowing through the drive transistor 1.

A first feedback loop L1 is a system for feeding back an output of the operational amplifier 3 to a non-inverting input terminal thereof via the drive transistor 1 and the drive output terminal 4. The first feedback loop L1 functions to detect an output voltage at the drive output terminal 4 and feed back it to the operational amplifier 3.

A second feedback loop L2 is a system for feeding back the output of the operational amplifier 3 to an inverting input terminal via a detection transistor 2. The second feedback loop L2 functions to detect an output current i2 of the detection transistor 2, convert it to a voltage by using an adjustment element 5, and feed back the voltage to the operational amplifier 3.

And the drive transistor 1 and the detection transistor 2 form a current mirror circuit. In this way a compensation circuit for compensating the output voltage Vo at the drive output terminal 4 (the drive transistor 1, the detection transistor 2, the operational amplifier 3, the first feedback loop L1, and the second feedback loop L2) is formed.

In order to facility appreciation, the values of the adjustment resistors 6 and 7 are neglected and it is supposed that the mirror ratio between the drive transistor 1 and the detection transistor 2 is set to 500:1.

The output voltage Vo at the drive output terminal 4 becomes Vref−Rref·i2. Denoting an output current flowing into the output terminal, i.e., a current flowing through the connection member 105 by Io (=i1), the output voltage Vo becomes Vref−Rref·Io/500. If the resistance value Rref of the adjustment element 5 is set equal to a value corresponding to a resistance value Rfpc of the connection member connected beyond the drive output terminal 4, therefore, the influence of the voltage drop across the connection member can be compensated. The adjustment element 5 may also be integrated on the same semiconductor chip as the drive circuit including the compensation circuit. Preferably, however, the adjustment element 5 is disposed on a flexible film on which the semiconductor chip is mounted, or in a wiring circuit, as an outside resistor for the chip.

Thus, according to the present embodiment, the output voltage is controlled to be constant under the control of the operational amplifier 3 by using the first feedback loop L1 for detecting the output voltage Vo at the drive output terminal 4 and feeding back the output voltage Vo to the operational amplifier 3. As a result, the variation in the output voltage caused by the voltage drop based on on-resistance (Ron) of the drive transistor 1 itself can be suppressed.

Furthermore, since it becomes unnecessary to use such a large transistor that the on-resistance Ron can be neglected, the area occupied by the drive circuit on the chip can be reduced and the drive circuit can be provided inexpensively.

The current Io (i1) flowing through the drive output terminal 4 is detected in real time by using the mirror circuit including mainly the drive transistor 1 and the detection transistor 2, and compensation is conducted on the basis of the detected current. Without providing a voltage detection point beyond the drive output terminal 4, therefore, the voltage drop caused by the resistance Rfpc of the connection member 15 and the current flowing through the resistance Rfpc can be compensated. Therefore, the voltage drop that can be compensated is not restricted to the resistance Rfpc, but the voltage drop across resistance Ryo of the connection member in the panel can also be compensated according to setting of the resistance value of the adjustment element 5.

And since the current i1 is detected by the mirror circuit, it is possible to reduce the detected current i2 and power consumption required for the detection by suitable setting in the mirror ratio, integration of the compensation circuit into a single chip being facilitated. Since the adjustment resistors 6 and 7 are provided as occasion demands, they may be omitted. In this case, the ratio between the drive current i1 and the detected current i2 can be determined by only the mirror ratio between the transistor 1 and the transistor 2.

Furthermore, it is sufficient to design only the adjustment element 5, which is a resistor, according to the resistance value Rfpc of the connection member 105 to be compensated, or form the resistance value Rref so as to be adjustable by using a trimming resistor or a variable resistor. Therefore, versatility of the drive circuit is enhanced.

If the current ratio is adjusted with the resistance value of the current adjustment resistor 7 greater than the resistance value of the current adjustment resistor 6, a similar effect can be achieved in the present embodiment without increasing the mirror ratio, and strictly speaking, with a mirror ratio of 1:1.

Second Embodiment

Figure 2:
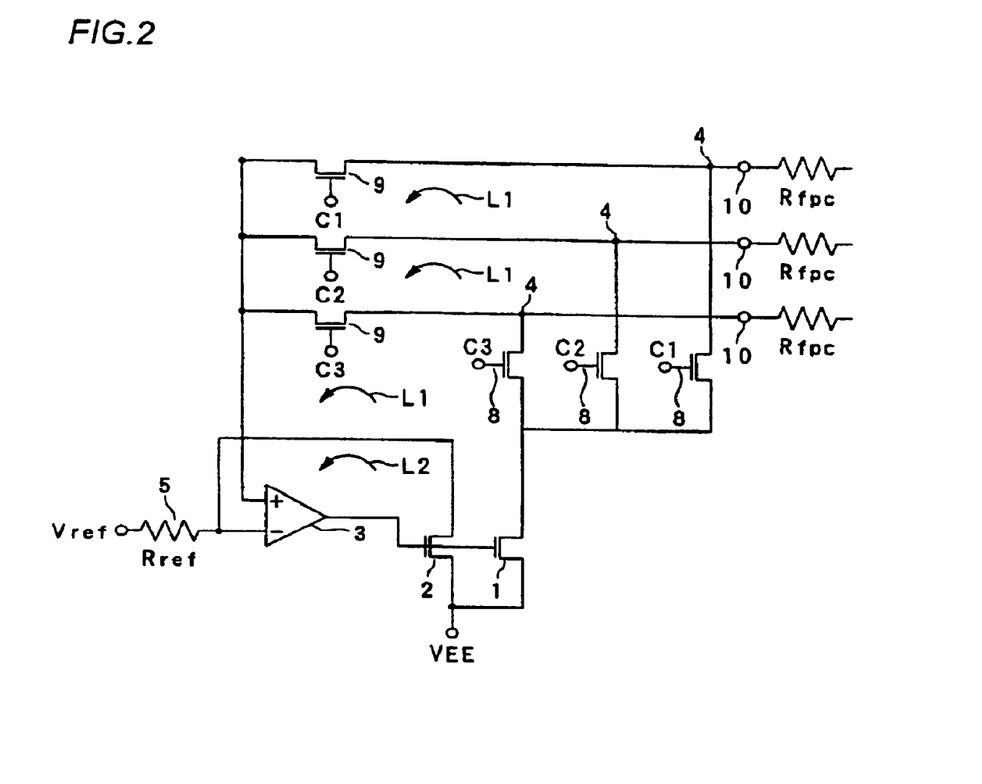
FIG. 2 is a circuit configuration diagram showing a drive circuit according to a second embodiment having multi-channel outputs for driving a plurality of emitting devices.

A drive circuit according to a second embodiment will now be described with reference to FIG. 2. FIG. 2 is a circuit configuration diagram showing a drive circuit according to the second embodiment having multi-channel outputs for driving a plurality of emitting devices.

The drive circuit according to the second embodiment differs from the drive circuit shown in FIG. 1 in that a drive selection switch 8 and a feedback loop selection switch 9 are provided to cope with multiple outputs and the main control sections in the compensation circuit, such as the drive transistor 1, the detection transistor 2, the operational amplifier 3 and the adjustment element 5, is provided in common to all channels. As compared with the case where those control sections are provided individually for respective channels, it is possible to improve the compensation precision for each channel while holding down the area occupied by the integrated circuit.

By selectively supplying channel selection control signals C1, C2, and C3 to switches 8 and 9, one of output terminals 10 can be selected. Only when selected, the feedback loop L1 of that channel is established, resulting in improved operation precision.

In this way, the output voltage Vo for compensating the voltage drop caused by the resistance Rfpc of the wiring member can be output only to the selected output terminal 10.

On the circuit diagram, the voltage detection point 4 is distant from the output terminal 10. Since the length between them is very short, however, the wiring resistance can be neglected.

Third Embodiment

Figure 3:
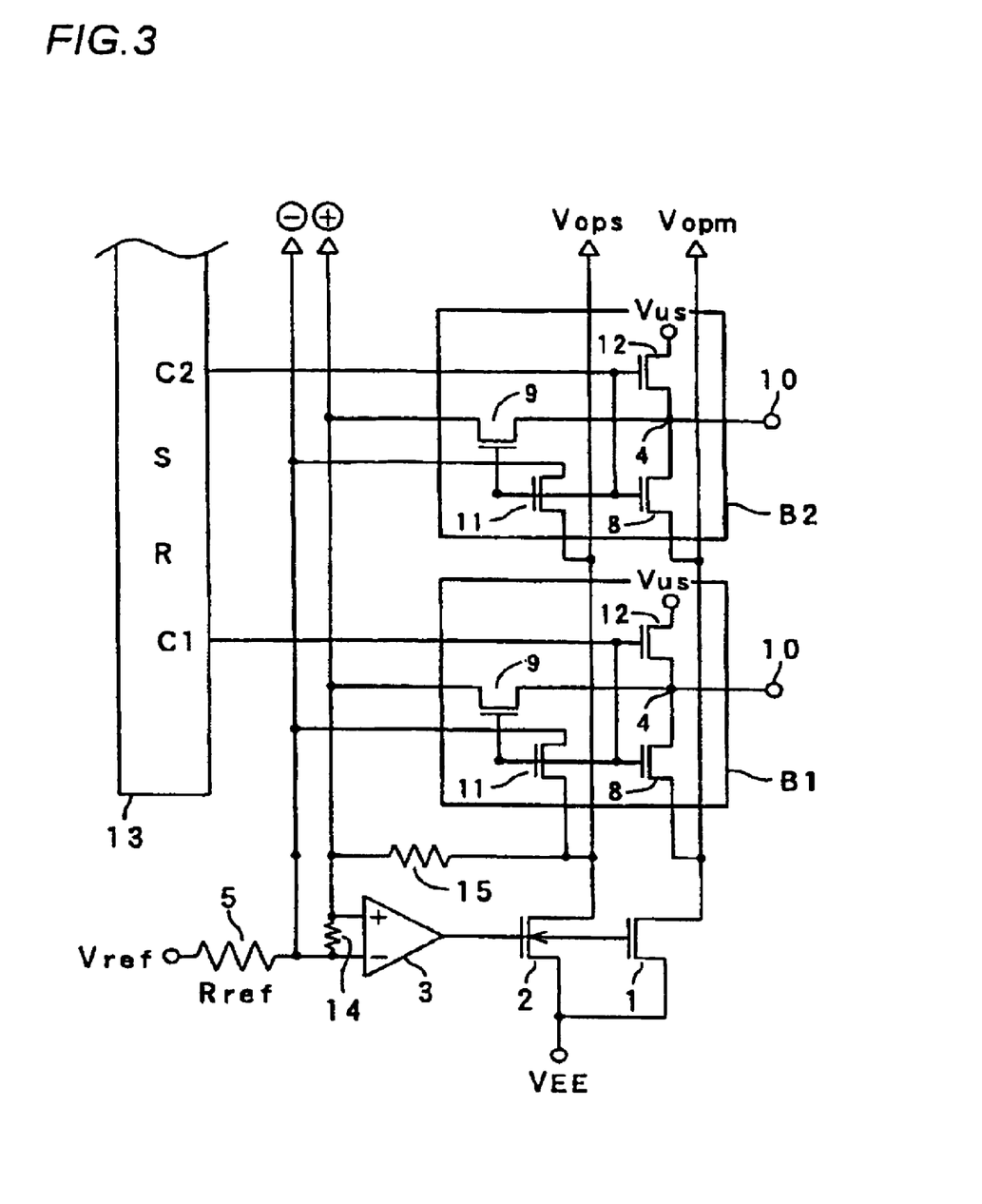
FIG. 3 is a circuit configuration diagram showing a drive circuit according to a third embodiment having multi-channel outputs suitable for driving emitting devices connected in a two-dimensional matrix form.

A drive circuit according to a third embodiment will now be described with reference to FIG. 3. FIG. 3 is a circuit configuration diagram showing d drive circuit according to the present embodiment having multi-channel outputs suitable for driving emitting devices connected in a two-dimensional matrix form.

The circuit configuration shown in FIG. 3 first differs from the configuration shown in FIG. 2 in that each of output circuits B1 and B2 of respective channels includes a pMOSFET as an unselected voltage supply switch 12, which holds the potential at the output terminal 10 when not selected so as to be a predetermined potential Vus, and an output buffer is a complementary circuit formed of the pMOSFET and an nMOSFET 8. The circuit configuration shown in FIG. 3 further differs from the configuration shown in FIG. 2 in that the second feedback loop L2 is established for each of the selected channels via a detection transistor 2 and a detection selection switch 11.

Every channel corresponding to at least one row in the matrix panel, a shift register 13 serving as a selection circuit supplies a control signal C1 or C2 to switches 8, 9, 11 and 12. In the selected channel for which the control signal is at the high level, the switches 8, 9 and 11 turn on and a selection voltage Vo having a potential determined according to Vref, Rref and i2 is output to the output terminal 10. On the other hand, in the unselected channel for which the control signal has become the low level, only the unselected voltage supply switch 12 turns on and its output terminal 10 is held at the potential Vus.

Such an operation is conducted successively until selection of all rows in the matrix panel is finished. As a result, scanning for one frame of the matrix panel is completed.

A connection member 15 is a resistor for fixing a drain voltage Vops of the detection transistor 2 to a predetermined value when all output terminals are outputting the unselected potential Vus.

A resistor 14 is a feedback gain adjustment element for determining the gain of the feedback circuit.

Fourth Embodiment

Figure 4:
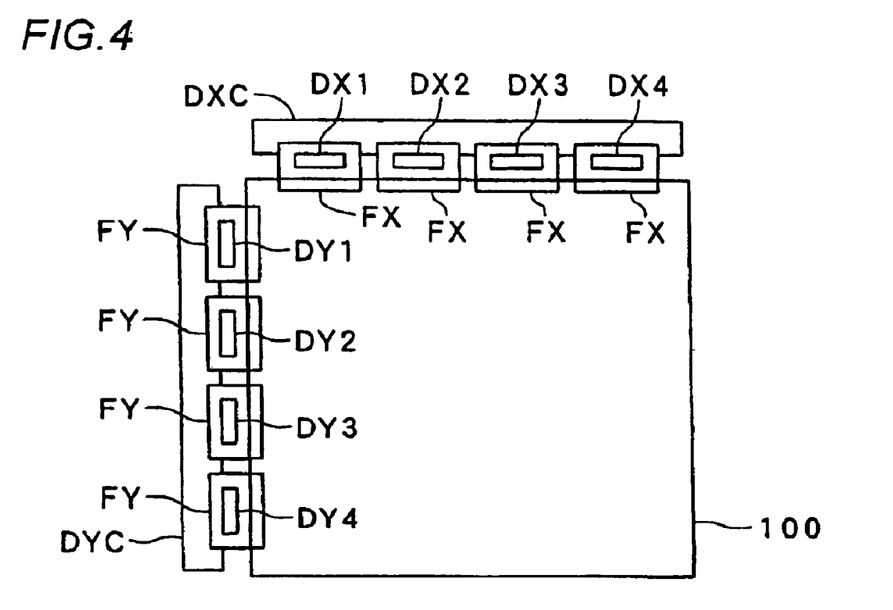
FIG. 4 is a schematic diagram showing a matrix panel module obtained by forming a drive circuit as a single chip and constructing the drive circuit together with a matrix panel.

An outline of a circuit configuration of a matrix panel module according to a fourth embodiment will now be described with reference to FIG. 4. FIG. 4 is a schematic diagram showing a matrix panel module obtained by forming a drive circuit as a single chip and panel constructing the drive circuit together with a matrix DY denotes a drive circuit chip as shown in FIGS. 1 to 3, and the DY forms a row selection circuit. Herein, row selection for a matrix panel is conducted by a plurality of drive circuit chips DY. In other words, channels in all drive circuit chips DY connected to all rows of the matrix panel are successively selected, and scanning for one frame is completed.

DX denotes a column drive circuit for generating a data signal based on pixel data supplied to column wiring.

FX and FY denote flexible wiring. Herein, the flexible wiring is mounted on the matrix panel 100 by using a tape carrier package in which the row selection circuit DY or the column drive circuit DX is packaged on a tape carrier such as a TAB film.

The above described adjustment element 5 may be provided for each drive circuit chip DY. Or one adjustment element 5 may be provided in common to all chip DYs.

Fifth Embodiment

Figure 5:
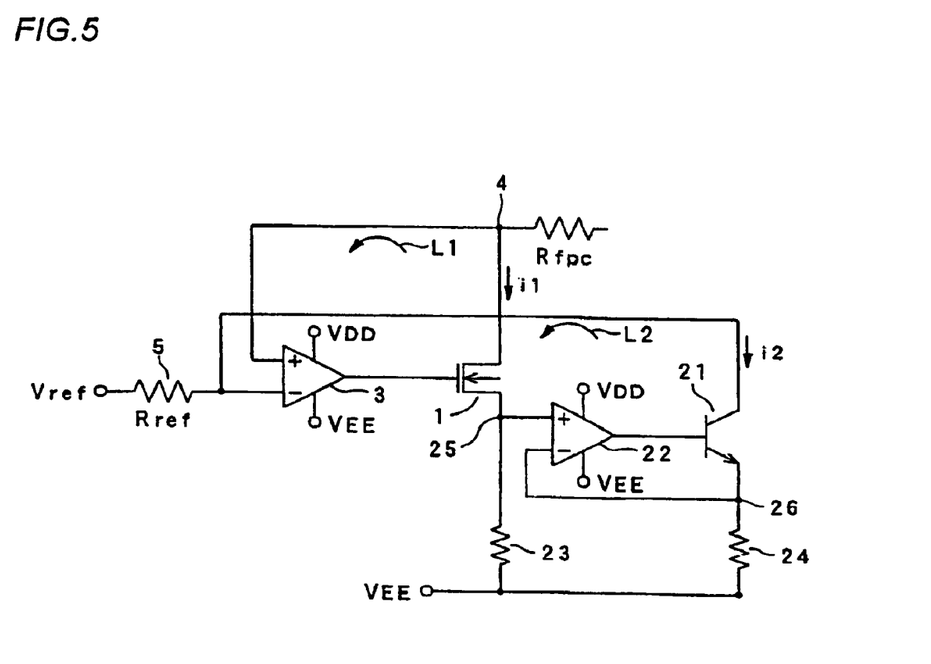
FIG. 5 is a circuit configuration diagram showing a basic example of a drive circuit according to a fifth embodiment.

A drive circuit according to a fifth embodiment will now be described with reference to FIG. 5. FIG. 5 is a circuit configuration diagram showing a basic example of a drive circuit according to the present embodiment.

The circuit configuration shown in FIG. 5 differs from the circuit configuration shown in FIG. 1 in that an NPN bipolar transistor is used as a detection transistor 21, and control means (operational amplifier) 22 for controlling a potential of the base serving as a control electrode of the bipolar transistor on the basis of an emitter voltage of the bipolar transistor is provided.

The operational amplifier 22 is connected at its non-inverting input terminal to a detection point 25 in order to detect a current i1 flowing through a drive transistor 1.

Specifically, a voltage at the detection point 25 determined by the current i1 and a current adjustment resistor 23 is input to the operational amplifier 22. The base voltage of the detection transistor 21 is controlled on the basis of the voltage at the detection point 25. Since the emitter voltage is fed back to an inverting input terminal, a voltage drop caused by a base-emitter voltage (offset voltage) of the detection transistor 21 is compensated at this time, and a current i2 proportionate to a current i1 flows through the detection transistor 21 with high precision. A current ratio can be determined mainly depending upon a resistance ratio between the current adjustment resistor 23 and a current adjustment resistor 24.

Denoting an output voltage at a drive output terminal 4 serving also as a voltage detection terminal by Vo, a current flowing through the drive output terminal 4 by Io (=i1), a resistance value of the current adjustment resistor 23 by R23, and a resistance value of the current adjustment resistor 24 by R24, the following relation $$Vo = Vref - Rref \cdot Io \cdot R23/R24$$

is obtained.

If the resistance ratio is R23:R24=1:500, it will be appreciated that the relation Vo=Vref−Rref·Io/500 is satisfied in the same way as the first embodiment.

According to the present embodiment, the current Io (i1) flowing through the drive output terminal 4 and the output voltage Vo at the drive output terminal 4 are detected in real time by using the detection transistor 21, and compensation is conducted on the basis of the current Io (i1) and the output voltage Vo. Without providing the voltage detection point beyond the drive output terminal, i.e., on the load side, therefore, the voltage drop caused by the resistance of the connection member and the current Io flowing through the resistance can be compensated.

Furthermore, if an outside adjustment resistor element is provided outside of the semiconductor integrated circuit that provides a drive circuit, design can be conducted irrespective of sizes of the pair of drive transistor and the detection transistor, in the case where the ratio between the drive current i1 and the detected current i2 is made large. Therefore, it is possible to suppress the nonuniformity in compensation characteristics among channels or the nonuniformity in compensation characteristics among semiconductor integrated circuits, which is caused by characteristic nonuniformity such as threshold dispersion in transistor fabrication.

Furthermore, since the ratio between the drive current and the detected current can be adjusted by the resistance ratio between the adjustment resistor elements, versatility of the drive circuit can be further enhanced.

In addition, since the offset voltage between the control electrode of the detection transistor and one of the main electrodes can be compensated by controlling the potential at the control electrode of the detection transistor according to the current i2 flowing through the detection transistor, the precision of the controllability is improved.

Sixth Embodiment

Figure 6:
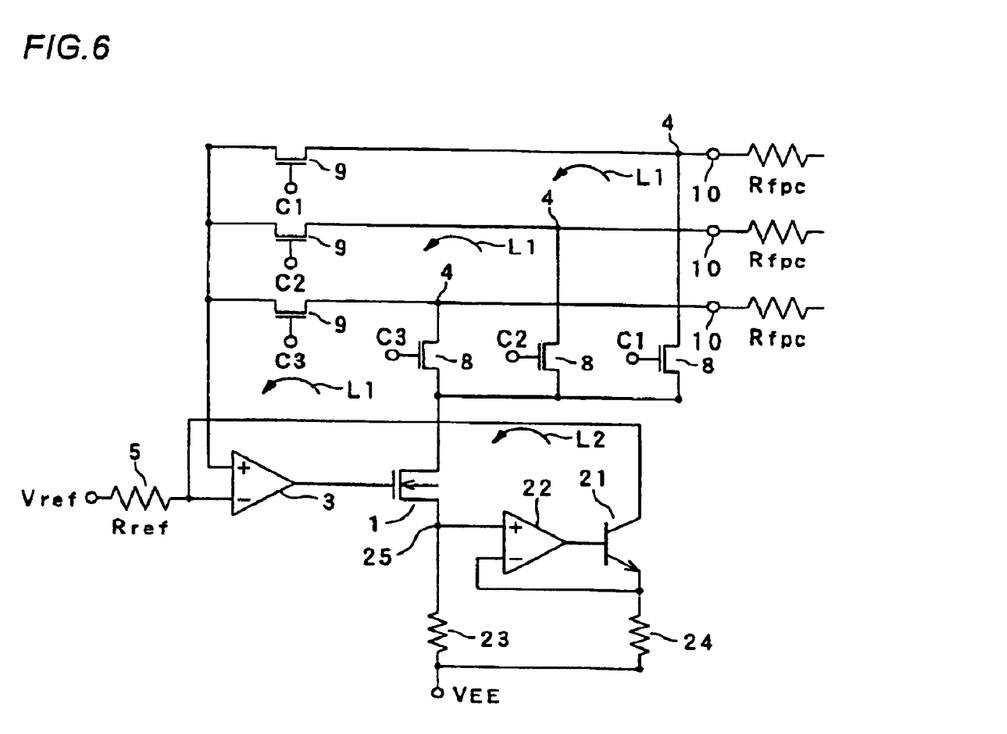
FIG. 6 is a circuit configuration diagram showing a drive circuit according to a sixth embodiment having multi-channel outputs for driving a plurality of emitting devices.

A drive circuit according to a sixth embodiment will now be described with reference to FIG. 6. FIG. 6 is a circuit configuration diagram showing a drive circuit according to the present embodiment having multi-channel outputs for driving a plurality of emitting devices.

The compensation circuit shown in FIG. 5 has been applied to the drive circuit having multi-channel outputs as shown in FIG. 2. Its operation is similar to operations described with reference to FIGS. 2 and 5.

Seventh Embodiment

Figure 7:
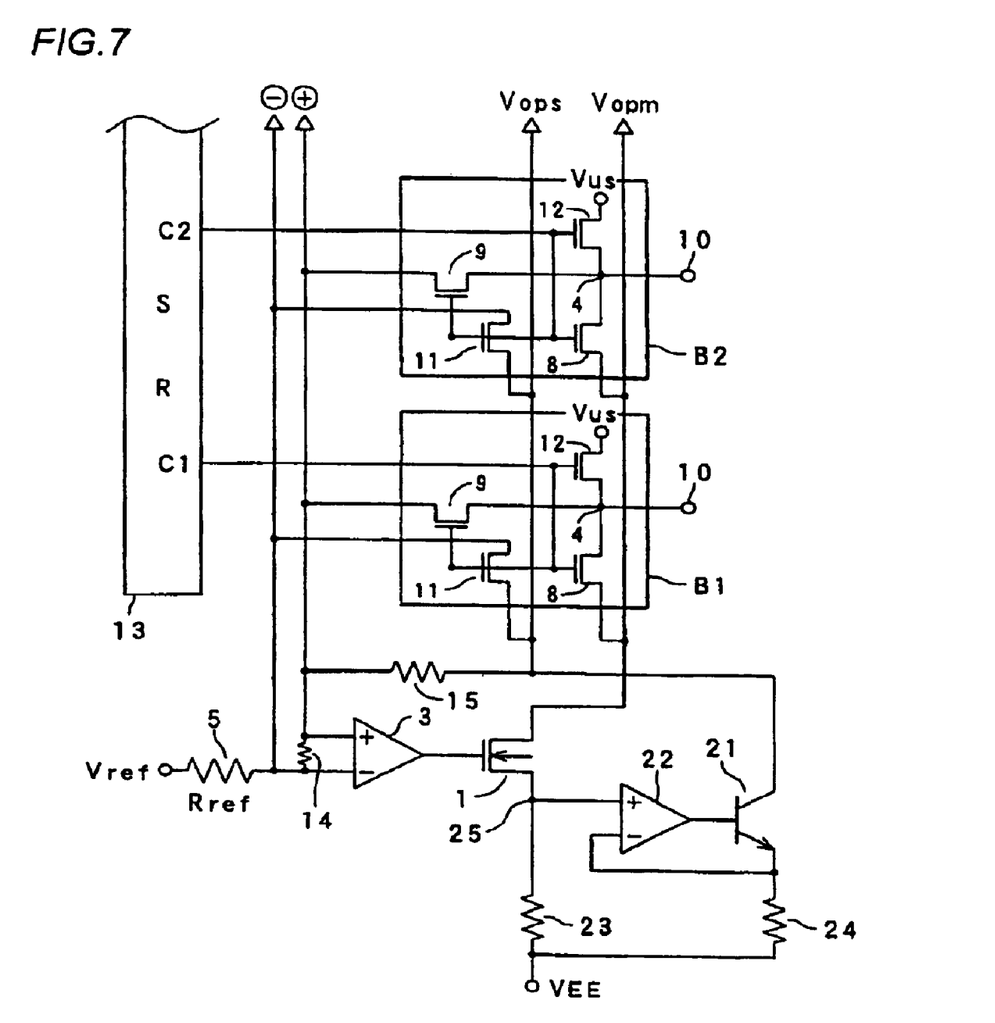
FIG. 7 is a circuit configuration diagram showing a drive circuit according to a seventh embodiment having multi-channel outputs suitable for driving emitting devices connected in a two-dimensional matrix form.

A drive circuit according to a seventh embodiment will now be described with reference to FIG. 7. FIG. 7 is a circuit configuration diagram showing a drive circuit according to the present embodiment having multi-channel outputs suitable for driving emitting devices connected in a two-dimensional matrix form.

The compensation circuit shown in FIG. 5 has been applied to the drive circuit having multi-channel outputs as shown in FIG. 3. Its operation is similar to operations described with reference to FIGS. 3 and 5.

Each of the adjustment element 5 and the current adjustment resistors 23 and 24 may also be provided singly in common for all chip DYs. However, it is preferable that at least the current adjustment resistors 23 and 24 among them are provided individually for each of the drive circuit chip DYs.

Each of the drive circuits according to embodiments shown in FIGS. 1 to 3 and described heretofore can be fabricated as a single chip monolithic IC with a BiCMOS process and by using a bipolar transistor as the operational amplifier, or with a full CMOS process inclusive of the operational amplifier.

Each of the drive circuits according to embodiments shown in FIGS. 5 to 7 can be fabricated with a BiCMOS process. If the detection transistor 21 and the operational amplifier are formed of MOSFETs, however, the drive circuit can be integrated in a monolithic form with a full CMOS process.

It is also preferable to adopt transistors called DMOS as at least the drive transistor 1 and the transistor 8 in the drive selection switch.

Although the simplest mirror circuit is used in each of the drive circuits according to the embodiments shown in FIGS. 1 to 3, a different well-known mirror circuit can also be used.

As the control means in each of the embodiments shown in FIGS. 5 to 7, a single transistor connected at its control electrode, such as its base or gate, to the detection point 26 can also be used instead of the operational amplifier.

In addition, in each of the embodiments, it is also possible to invert the polarity of the power supply voltage and use transistors having opposite conduction types. If an inverter is connected in series with the operational amplifier, it is also possible to invert the polarity at the input terminal. In this way, the present invention is not limited to the illustrated circuits.

The connection member used in the present invention is not limited to the flexible wiring, but may be thin film or thick film wiring on the matrix panel, or may be a combination of them.

The above-described adjustment element used in the present invention may be provided for each drive circuit chip, or may also be provided singly in common for all chips.

In the case where a drive circuit according to the present invention is used as a drive circuit for the matrix panel, the mounting method of the drive circuit is not limited to the above-described mounting method using the tape carrier package, but a method of arranging a plurality of chips side by side on a common wiring board and connecting the chips to the matrix panel with a flexible cable, which is called COB (chip on board), may be used. Or a method of connecting the row selection circuits DY and the column drive circuits DX directly to the matrix panel, which is called COG (chip on glass), may also be used.

As emitting devices in the present invention, inorganic light emitting diodes, organic light emitting diodes, semiconductor lasers, inorganic electroluminescence devices, organic electroluminescence devices, field emission electron-emitting devices and surface conduction electron-emitting devices can be mentioned. And the drive circuit according to the present invention is suitably used as a drive circuit for a plurality of emitting devices arranged in arbitrary positions and connected in a one-dimensional or two-dimensional matrix form.

As heretofore described, according to the present invention, the voltage drop caused by connection resistance can be compensated with high precision by using a relatively simple configuration even if transistors which are smaller than those conventionally used are used in the output buffers. A drive circuit that is relatively inexpensive and high in precision can be provided.

What is claimed is:

1. A drive circuit comprising:

a drive output terminal for connecting emitting devices that emit at least light or electrons to the drive circuit via a connection member; and a compensation circuit for compensating an output voltage supplied from the drive output terminal, wherein the compensation circuit comprises:

a drive transistor connected at a pair of its main electrodes respectively to a drive output terminal side and a reference voltage source side, an operational amplifier for controlling an output voltage that is output from the drive transistor, a detection transistor for detecting a current that flows through the drive transistor, the drive transistor and the detection transistor forming a mirror circuit, a first feedback loop for detecting the output voltage at the drive output terminal and feeding back the output voltage to the operational amplifier, and a second feedback loop for detecting an output current of the detection transistor and feeding back the output current to the operational amplifier.

2. The drive circuit according to claim 1, wherein the drive transistor and the detection transistor form a mirror circuit having a current mirror ratio of N:1, where N>1.

3. A drive circuit according to claim 1, wherein current adjustment resistors integrated into a single chip together with the drive circuit are connected respectively to the drive transistor and the detection transistor.

4. A drive circuit according to claim 1, wherein the current that flows through the detection transistor is converted to a voltage by an adjustment element having a preset resistance value according to a resistance value of the connection member, and the output voltage is compensated on the basis of the voltage obtained by the conversion, under control of the operational amplifier.

5. A drive circuit comprising:

a drive output terminal for connecting emitting devices that emit at least light or electrons to the drive circuit via a connection member; and a compensation circuit for compensating an output voltage supplied from the drive output terminal, wherein the compensation circuit comprises:

a drive transistor connected at a pair of its main electrodes respectively to drive output terminal side and a reference voltage source side, an operational amplifier for controlling an output voltage that is output from the drive transistor, a detection transistor for detecting a current that flows through the drive transistor, a first feedback loop for detecting the output voltage at the drive output terminal and feeding back the output voltage to the operational amplifier, a second feedback loop for detecting a current that flows through the detection transistor and feeding back the current detected to the operational amplifier, and control means for controlling a potential at a control electrode of the detection transistor according to the current that flows through the detection transistor.

6. A drive circuit according to claim 5, wherein the current that flows through the detection transistor is converted to a voltage by an adjustment element having a preset resistance value according to a resistance value of the connection member, and the output voltage is compensated on the basis of the voltage obtained by the conversion, under control of the operational amplifier.

7. A drive circuit comprising:

an output terminal;

a first transistor having a control electrode and a first main electrode connected to an output terminal side and a second main electrode connected to a voltage source side;

an operational amplifier having an output connected to the control electrode of said first transistor;

a second transistor having a control electrode connected to the control electrode of said first transistor; and a resistor connected to a main electrode of said second transistor whereby a voltage according to a current which flows through said second transistor is obtained, wherein said output terminal is connected to one input of said operational amplifier, and the voltage is inputted to another input of said operational amplifier.

8. A drive circuit comprising:

an output terminal;

a first transistor for flowing a current which flows via said output terminal;

a second transistor with which said first transistor forms a mirror circuit;

a resistor for converting a current which flows through said second transistor to a voltage; and an operational amplifier for controlling an output voltage which is supplied to said output terminal by said first transistor, wherein said output terminal is connected to one input of said operational amplifier, and the voltage converted by said resistor is inputted to another input of said operational amplifier.

9. A drive circuit comprising:

an output terminal;

a first transistor having a first main electrode connected to an output terminal side and a second main electrode connected to a voltage source side;

a first operational amplifier having an output connected to a control electrode of said first transistor;

a second transistor having a control electrode to which a voltage according to a current that flows through the first transistor is applied;

a second operational amplifier for applying the voltage to the control electrode of said second transistor, wherein a voltage that corresponds to the current which flows through said first transistor is inputted to said second operational amplifier; and a resistor connected to a main electrode of said second transistor whereby a voltage according to a current which flows through said second transistor is obtained, wherein said output terminal is connected to one input of said first operational amplifier, and the voltage obtained by said resistor is inputted to another input of said first operational amplifier.

10. A drive circuit according to claim 9, further comprising a second resistor for converting the current which flows through said first transistor to the voltage to be inputted to said second operational amplifier.

11. A display apparatus comprising:

a device for displaying an image;

a wiring connected to said device; and the drive circuit as set forth in claim 7, wherein said output terminal of said drive circuit is connected to said wiring.

12. A display apparatus comprising:

a plurality of devices for displaying an image;

a plurality of wirings relatively connected to each of said devices; and the drive circuit as set forth in claim 7, wherein said drive circuit has a plurality of output terminals relatively connected to each of said wirings; and a switch for selectively connecting at least one of the plurality of output terminals to said first transistor.

13. A display apparatus comprising:

a device for displaying an image;

a wiring connected to said device; and a drive circuit as defined in claim 8, wherein said output terminal of said drive circuit is connected to said wiring.

14. A display apparatus comprising:

a plurality of devices for displaying an image;

a plurality of wirings relatively connected to each of said devices;

the drive circuit as set forth in claim 8, wherein said drive circuit has a plurality of output terminals relatively connected to each of said wirings; and a switch for selectively connecting at least one of the plurality of output terminals to said first transistor.

15. A display apparatus comprising:

a device for displaying an image;

a wiring connected to the device; and the drive circuit as set forth in claim 9, wherein the output terminal of said drive circuit is connected to said wiring.

16. A display apparatus comprising:

a plurality of devices for displaying an image;

a plurality of wirings relatively connected to each of the devices;

the drive circuit as set forth in claim 9, wherein the drive circuit has a plurality of output terminals relatively connected to each of said wirings; and a switch for selectively connecting at least one of the plurality of output terminals to the said transistor.

* * * * *

UNITED STATES PATENT AND TRADEMARK OFFICE
CERTIFICATE OF CORRECTION

PATENT NO. : 6,946,799 B2
DATED : September 20, 2005
INVENTOR(S) : Kenji Shino et al.

It is certified that error appears in the above-identified patent and that said Letters Patent is hereby corrected as shown below:

Column 1,
Line 26, "currents" should read -- current --; and
Line 67, "for emitting" should read -- for an emitting --.

Column 3,
Line 28, "them" should read -- what is stated --;
Line 55, "back it" should read -- it back --; and
Line 65, "way" should read -- way, --.

Column 4,
Lines 14 and 38, "therefore," should be deleted;
Line 49, "ratio," should read -- ratio; --; and
Line 58, "he" should read -- be --.

Column 5,
Line 37, "d" should read -- a --;
Line 53, "corresponding" should read -- corresponds --;
Line 54, "a shift" should read -- and a shift --; and
Line 59, "output" should read -- outputted --.

Column 6,
Line 14, "matrix" should read -- matrix panel. --; and
Line 30, "above described" should read -- above-described --.

Column 8,
Line 3, "are" shouold read -- be --; and
Line 59, "mentioned" should read -- used --.

UNITED STATES PATENT AND TRADEMARK OFFICE
CERTIFICATE OF CORRECTION

PATENT NO. : 6,946,799 B2
DATED : September 20, 2005
INVENTOR(S) : Kenji Shino et al.

It is certified that error appears in the above-identified patent and that said Letters Patent is hereby corrected as shown below:

Column 11,
Line 15, "and" should be deleted.

Signed and Sealed this

Twenty-eighth Day of March, 2006

JON W. DUDAS
*Director of the United States Patent and Trademark Office*